(12) United States Patent
Nag et al.

(10) Patent No.: US 10,649,018 B2
(45) Date of Patent: May 12, 2020

(54) TIME ALIGNMENT OF LIGHTNING EMISSIONS AT LF-MF USING WAVEFORM FEATURE COMPARISON (71) Applicant: Vaisala, Inc., Louisville, CO (US)

(72) Inventors: Amitabh Nag, Melbourne, FL (US); Martin J. Murphy, Louisville, CO (US)

(73) Assignee: Vaisala, Inc., Louisville, CO (US)

( * ) Notice: Subject to any disclaimer, the term of this patent is extended or adjusted under 35 U.S.C. 154(b) by 531 days.

(21) Appl. No.: 15/474,458

(22) Filed: Mar. 30, 2017

(65) Prior Publication Data

US 2018/0288849 A1  Oct. 4, 2018

(51) Int. Cl.
*G01R 29/08* (2006.01)
*G01W 1/16* (2006.01)

(52) U.S. Cl.
CPC ........... *G01R 29/0842* (2013.01); *G01W 1/16* (2013.01); *Y02B 20/42* (2013.01)

(58) Field of Classification Search
CPC ............ H05B 37/0227; H05B 37/0281; G01R 29/0842; Y02B 20/42; G01W 1/16
See application file for complete search history.

(56) References Cited

U.S. PATENT DOCUMENTS 6,791,311 B2 * 9/2004 Murphy ............. G01R 29/0842
324/72

OTHER PUBLICATIONS

Wikipedia:CD-ROM<https://web.archive.org/web/20080910083327/http://en.wikipedia.org/wiki/CD-ROM> retrieved by Archive.org on Sep. 10, 2008 (Year: 2008).*

* cited by examiner

*Primary Examiner* — Alexander Satanovsky
*Assistant Examiner* — Mark I Crohn
(74) *Attorney, Agent, or Firm* — Maschoff Brennan; Paul G. Johnson (57) ABSTRACT

A method to generate data to geolocate lightning pulses may include detecting in an environment EMF generated from the lightning pulses. The method may include producing lightning-EMF from the detected EMF where the lightning-EMF may represent the EMF generated from the lightning pulses. The method may include extracting a lightning-waveform-feature set from the lightning-EMF data, including extracting one or more waveform features for each of the lightning pulses from the lightning-EMF data. The method may also include transmitting the extracted lightning-waveform-feature set to a server to perform time alignment on multiple extracted lightning-waveform-feature sets received from multiple lightning-detection sensors and to geolocate the lightning pulses based on the time-aligned extracted lightning-waveform-feature sets.

20 Claims, 5 Drawing Sheets

TIME ALIGNMENT OF LIGHTNING EMISSIONS AT LF-MF USING WAVEFORM FEATURE COMPARISON

FIELD

Some embodiments described herein generally relate to time alignment of lightning emissions at low frequency (LF) to medium frequency (MF) using waveform feature comparison.

BACKGROUND

Unless otherwise indicated herein, the materials described herein are not prior art to the claims in the present application and are not admitted to be prior art by inclusion in this section.

The time alignment and subsequent geolocation of multiple electromagnetic emissions or pulses from lightning that are separated by a few or more microseconds ($\mu s$) is currently done efficiently only with dense and costly arrays of sensors operating at very high frequencies (VHF).

Generally speaking, VHF may include a range from 30-300 megahertz (MHz). Typically, however, sensors used in lightning geolocation systems detect mostly below about 150 MHz, but not over the entire range from 30-150 MHz. Instead, typical bandwidths of such sensors individually may range from less than 1 MHz up to about 6 MHz.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein include a method for time alignment and subsequent geolocation of multiple electromagnetic emissions or pulses from lightning that are separated by a few or more $\mu s$. The method may align and geolocate such lightning pulses based on broadband LF to MF signals which may be received by networks of sensors in which sensors may be separated by tens to hundreds of kilometers. In comparison, some other lightning geolocation systems require dense arrays of sensors operating in the VHF range. The embodiments described herein may be significantly more cost-effective while achieving performance similar to that of lightning geolocation systems with dense arrays of sensors operating in the VHF range.

In some embodiments, a method implemented by, e.g., a lightning-detection sensor, to generate data to geolocate one or more lightning sources that generate electromagnetic field (EMF) emissions in the form of lightning pulses may include detecting in an environment the lightning pulses. The method may include producing lightning-EMF data from the detected lightning pulses, the lightning-EMF data representing the lightning pulses. The method may include extracting a lightning-waveform-feature set from the lightning-EMF data, including extracting one or more waveform features for each of the lightning pulses from the lightning-EMF data. The method may include transmitting the extracted lightning-waveform-feature set to a server to perform time alignment on extracted lightning-waveform-feature sets received from multiple lightning-detection sensors and to geolocate the one or more lightning sources based on the time-aligned extracted lightning-waveform-feature sets.

In some embodiments, extracting one or more waveform features for each of the lightning pulses includes: analyzing the lightning-EMF data to identify one or more pulse segments in the lightning EMF data, each of the pulse segments representing at least a portion of a different one of the lightning pulses; and for each of the lightning pulses, calculating a pulse duration as a duration of time of a corresponding one or more of the pulse segments. The one or more waveform features for each of the lightning pulses may include a corresponding pulse duration.

In some embodiments, extracting one or more waveform features for each of the lightning pulses includes: analyzing the lightning-EMF data to identify pulse segments in the lightning EMF data, each of the pulse segments representing at least a portion of a different one of the lightning pulses; and calculating a rise time for each of the pulse segments. The one or more waveform features for each of the lightning pulses may include a corresponding rise time.

In some embodiments, extracting one or more waveform features for each of the lightning pulses includes: analyzing the lightning-EMF data to identify pulse segments in the lightning EMF data, each of the pulse segments representing at least a portion of a different one of the lightning pulses; and calculating a peak-to-zero time for each of the pulse segments based on a duration of time from a peak magnitude of the pulse segment to a following zero crossing. The one or more waveform features for each of the lightning pulses may include a corresponding peak-to-zero time.

In some embodiments, extracting one or more waveform features for each of the plurality of lightning pulses includes: analyzing the lightning-EMF data to identify bipolar pulses in the lightning EMF data, each of the bipolar pulses representing a different one of the lightning pulses and each of the bipolar pulses including an initial segment and an opposite polarity segment also known as an opposite polarity overshoot; and for each of the lightning pulses, calculating an initial-peak-to-opposite-peak time as a duration of time between a peak magnitude of the corresponding initial segment and a peak magnitude of the corresponding opposite polarity overshoot of the corresponding bipolar pulse. The one or more waveform features for each of the lightning pulses may include a corresponding initial-peak-to-opposite-peak time.

In some embodiments, extracting one or more waveform features for each of the lightning pulses includes: analyzing the lightning-EMF data to identify bipolar pulses in the lightning EMF data, each of the bipolar pulses representing a different one of the lightning pulses; and for each of the lightning pulses represented by a corresponding one of the bipolar pulses, calculating at least one of an initial segment duration or an opposite polarity overshoot duration. The one or more waveform features for each of the lightning pulses may include at least one of a corresponding initial segment duration or a corresponding opposite polarity overshoot duration.

In some embodiments, extracting one or more waveform features for each of the lightning pulses includes: analyzing the lightning-EMF data to identify bipolar pulses in the lightning EMF data, each of the bipolar pulses representing a different one of the lightning pulses and each of the bipolar pulses including an initial segment of a first polarity and an opposite polarity overshoot of a second polarity opposite the first polarity; and for each of the lightning pulses, calculating at least one of a first ratio of the peak magnitude of the initial segment to the peak magnitude of the opposite polarity overshoot or a second ratio of the peak magnitude of the opposite polarity overshoot to the peak magnitude of the initial segment. The one or more waveform features for each of the lightning pulses may include at least one of a corresponding first ratio or a corresponding second ratio.

In some embodiments, extracting one or more waveform features for each of the lightning pulses includes: analyzing the lightning-EMF data to identify pulse segments in the lightning EMF data, each of the pulse segments representing at least a portion of a different one of the lightning pulses; and calculating an area under a curve of pulse segments between zero crossings for each of the pulse segments. The one or more waveform features for each of the lightning pulses may include a corresponding area under a curve of pulse segments between zero crossings.

In some embodiments, detecting the lightning pulses includes detecting the lightning pulses in a LF to MF range.

In some embodiments, prior to the extracting, the method may further include determining occurrence of the lightning pulses from the lightning-EMF data.

In some embodiments, at least some of the lightning pulses may be separated in time by less than 300 μs.

In some embodiments, a non-transitory computer-readable medium may have computer-readable instructions stored thereon that are executable by a processor to perform or control performance of any of the foregoing methods.

In some embodiments, a method implemented by, e.g., a server, to geolocate lightning pulses includes receiving lightning-waveform-feature sets from multiple lightning-detection sensors. Each of the lightning-waveform-feature sets may include one or more waveform features for each of multiple lightning pulses that generate EMF in an environment. The lightning-waveform-feature sets may include a first lightning-waveform-feature set received from a first lightning-detection sensor and a second lightning-waveform-feature set received from a second lightning-detection sensor. The method may include comparing the first lightning-waveform-feature set with the second lightning-waveform-feature set, including comparing waveform features of the first lightning-waveform-feature set with waveform features of the second lightning-waveform-feature set. The method may include time aligning the first lightning-waveform-feature set with the second lightning-waveform-feature set based on the comparing to generate time-aligned waveform-feature sets. The method may include geolocating each of the lightning pulses based on the time-aligned waveform-feature sets.

In some embodiments, prior to time aligning the first and second lightning-waveform-feature sets, the method may include performing an initial approximate time alignment of the first and second lightning-waveform-feature sets based on absolute time measurements included in or with the first and second lightning-waveform-feature sets.

In some embodiments, the comparing and the time aligning may include: comparing pairs of waveform features from the first and second lightning-waveform-feature sets in sequence; and advancing or delaying in time one of the first and second lightning-waveform-feature sets relative to the other until the pairs of sequentially compared waveform features match or substantially match. Each of the pairs of waveform features may include one waveform feature from the first lightning-waveform-feature set and another waveform feature from the second lightning-waveform-feature set.

In some embodiments, advancing or delaying in time one of the first and second lightning-waveform-feature sets relative to the other until the pairs of sequentially compared waveform features match or substantially match may include advancing or delaying in time one of the first and second lightning-waveform-feature sets relative to the other until, for each of at least some of the pairs, a value of one of the waveform features of the first or second lightning-waveform-feature sets is within a threshold range of a value of the waveform feature of the other of the first or second lightning-waveform-feature sets.

In some embodiments, each of the one or more waveform features for each of the lightning pulses may include a waveform feature in the group consisting of: pulse duration, rise time, peak-to-zero-time, initial-peak-to-opposite-peak time, initial segment duration, opposite polarity overshoot duration, ratio of peak magnitude of the initial segment to peak magnitude of the opposite polarity overshoot, ratio of peak magnitude of the opposite polarity overshoot to peak magnitude of the initial segment, and area under a curve of pulse segments between zero crossings.

In some embodiments, the geolocating may be based on a time difference of arrival calculation for each of the lightning pulses.

In some embodiments, at least some of the lightning pulses may be separated in time by less than 300 μs.

In some embodiments, a non-transitory computer-readable medium may have computer-readable instructions stored thereon that are executable by a processor to perform or control performance of any of the foregoing methods.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Some embodiments described herein include a method for time alignment and subsequent geolocation of multiple electromagnetic emissions or pulses from lightning that are separated by a few or more µs. The method may align and geolocate such lightning pulses based on broadband LF to MF signals which may be received by networks of sensors in which sensors may be separated by tens to hundreds of kilometers.

Currently, time alignment of lightning pulses between multiple sensors in a lightning location system considers only inter-pulse time intervals (as calculated between the arrival time of a specific pulse feature (e.g. onset time, time of peak magnitude, or zero-crossing time) of successive pairs of pulses) of the electromagnetic waveform which has been measured at multiple sensors. Using current methods, time alignment of lightning pulses is inaccurate when the time intervals between sequential pulses are similar to each other and shorter than a propagation time between sensors in the lightning location system. The alignment inaccuracy may be exacerbated by any of the following: any non-uniqueness of the inter-pulse intervals between different pulse trains, the time resolution of the sensor, and the effect of propagation over lossy soil.

Embodiments described herein may identify and align the same pulse as received by different sensors by using multiple waveform features such as: total pulse duration, rise time, peak-to-zero time, initial-peak-to-opposite-peak time, ratio of peak magnitude of the initial segment to peak magnitude of the opposite polarity overshoot, ratio of peak magnitude of the opposite polarity overshoot to peak magnitude of the initial segment, duration of opposite polarity overshoot, duration of first polarity segment, and area under the curve between zero crossings. Embodiments of the method described herein may also use inter-pulse intervals to compare and align pulses. This may allow for proper time alignment of closely-spaced pulses with sensors that may be tens of kilometers apart or more.

Embodiments described herein may allow for geolocation and even lightning mapping. Lightning mapping may include geolocation of enough lightning sources that the full spatial extent of a lightning channel is known at LF to MF. Because the waveform features are measured in LF to MF they are not limited by the relatively high propagation loss of VHF signals.

Figure 1:
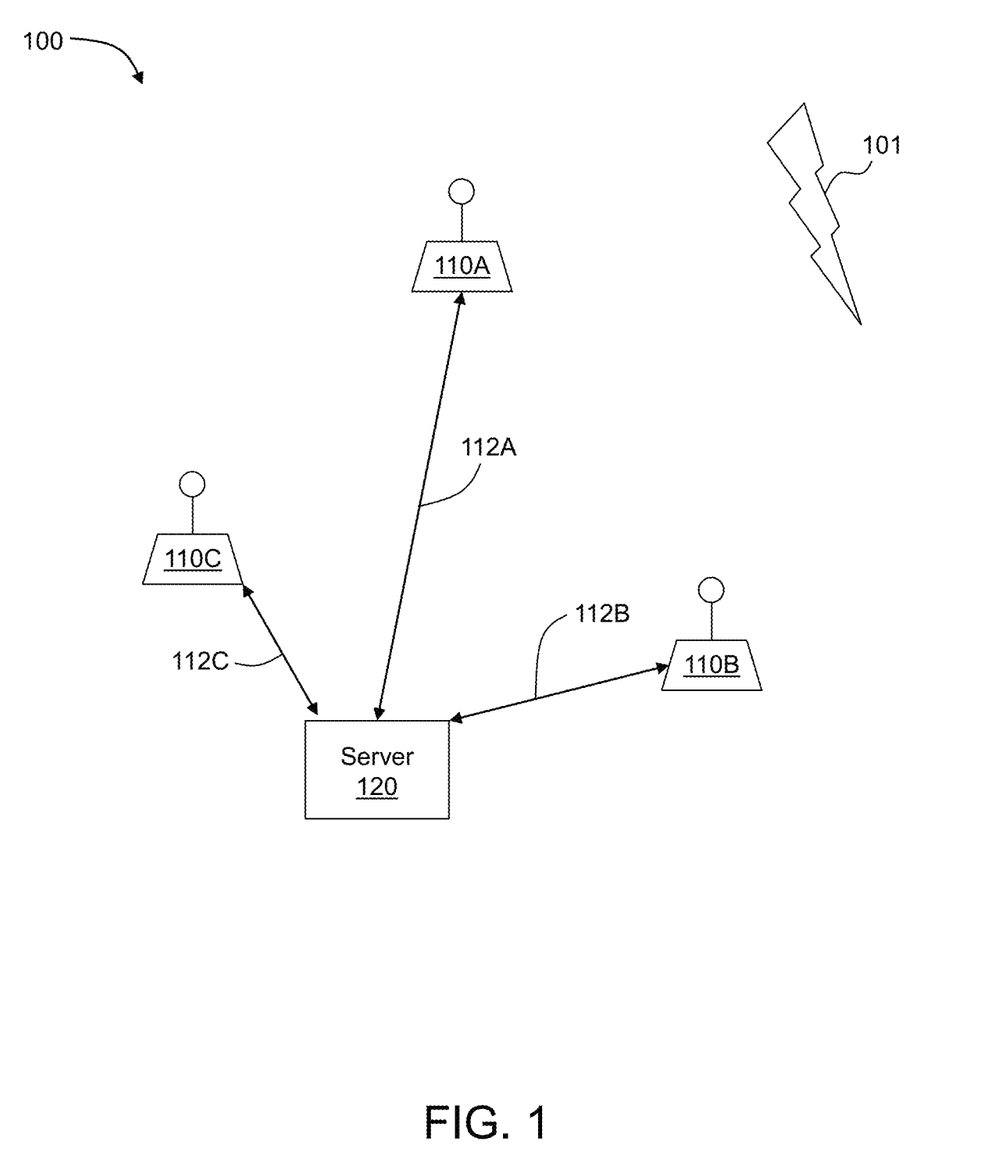
FIG. 1 is a diagram of an example lightning-geolocation system that may be used to geolocate one or more lightning sources.

FIG. 1 is a diagram of an example lightning-geolocation system 100 that may be used to geolocate one or more lightning sources 101, arranged in accordance with at least one embodiment described herein. The lightning-geolocation system 100 may include multiple lightning-detection sensors 110 and a server 120. Three sensors are shown: first lightning-detection sensor 110A, second lightning-detection sensor 110B, and third lightning-detection sensor 110C (collectively referred to as lightning-detection sensors 110 and/or individually referred to as lightning-detection sensor 110).

A single lightning source 101 is depicted in FIG. 1 for simplicity. The lightning source 101 may include a discharge with movement of charge in the earth's atmosphere or between the atmosphere and earth, and which generates or emits lightning-EMF emissions that may be detected (e.g., by the lightning-detection sensors 110) in the form of lightning pulses. The lightning source 101 may include a cloud-to-ground lightning discharge (CG), a cloud-to-cloud lightning discharge (CC), an intracloud lightning discharge (IC), or a cloud-to-air lightning discharge. A CG may include an electrical discharge between a cloud and the ground. An IC may include an electrical discharge occurring within a single cloud. A CC may include an electrical discharge that starts in one cloud and terminates in a separate cloud. A cloud-to-air lightning discharge may include an electrical discharge that starts in a cloud and terminates in air. The lightning source 101 may include a lightning flash, multiple lightning flashes, and/or other lightning emissions. A lightning flash may have a duration of, e.g., a hundred milliseconds (ms) or more. Generally, a lightning flash may emit multiple pulses (or lightning pulses), each with a duration on the order of a few µs or more, depending on how "pulse" is defined.

While three lightning-detection sensors 110 are shown, any number of sensors may be used and/or included in the lightning-geolocation system 100. Each lightning-detection sensor 110 may detect electromagnetic emissions or changes in electromagnetic fields ("EMF") resulting from lightning sources such as the lightning source 101. The EMF or changes in EMF resulting from a lightning source may be referred to herein as lightning EMF or lightning EMF emissions. In these and other embodiments, each of the lightning-detection sensors 110 may include an antenna designed to detect the lightning EMF in the form of pulses from the lightning source 101 and produce data representative of the lightning EMF or the time derivative of the lightning EMF. Data generated by a lightning-detection sensor 110 may be referred to herein as EMF data. The EMF data generated by a lightning-detection sensor 110 may include data that represents lightning EMF and which may be referred to as lightning-EMF data and/or EMF data that did not result from a lightning source and which may be referred to as background EMF data.

The lightning-detection sensors 110 may be configured to measure amplitude of lightning EMF, or changes in the amplitudes of lightning EMF over time, or some other measure of the lightning EMF resulting from a lightning source. Additionally or alternatively, the lightning-detection sensors 110 may be configured to measure the polarity of the lightning EMF or changes in the polarity of the lightning EMF over time. In some embodiments, the lightning-detection sensors 110 may each be configured to measure a primary azimuthal direction corresponding to each lightning source. The EMF data may include polarity measurements and direction measurements and/or polarity and direction measurements may be derived from the EMF data. In particular, lightning-EMF data may include polarity and direction data corresponding to the lightning EMF. The lightning-detection sensors 110 may include timing devices. EMF data may include time data, for example time stamps corresponding to EMF data. In particular, lightning-EMF data may include time data or time stamps corresponding to the lightning EMF.

EMF may generally propagate radially outward from a lightning source through an environment over time. Accordingly, the lightning EMF from a single lightning source such as the lightning source 101 may reach the lightning-detection sensors 110 at varying times, depending on the location of each of the lightning-detection sensors 110 relative to the location of the lightning source 101.

In some embodiments, two or more lightning-detection sensors 110 may be used in the lightning-geolocation system 100. In some embodiments, the lightning-detection sensors 110 may include lightning-detection sensors that are distributed tens to hundreds of kilometers apart. A communication link 112A, 112B, 112C (collectively "communication link 112") between each of the lightning detection sensors 110 and the server 120 may allow the lightning-detection sensors 110 to send information to and receive information from the server 120. The information that the lightning-detection sensors 110 send to the server 120 may include, or be derived from, the lightning EMF and/or from the EMF data that may include lightning-EMF data and/or background EMF data generated by the sensors 110.

In an example implementation, the communication link 112 may include or be included in a network, such as one or more wide area networks (WANs) and/or local area networks (LANs) that enable the lightning-detection sensors 110 and/or the server 120 to communicate with each other. In some embodiments, the communication link 112 and/or the network includes the Internet, including a global internetwork formed by logical and physical connections between multiple WANs and/or LANs. Alternately or additionally, the communication link 112 and/or the network may include one or more cellular RF networks and/or one or more wired and/or wireless networks such as, but not limited to, 802.xx networks, Bluetooth access points, wireless access points, IP-based networks, or the like. The communication link 112 and/or the network may also include servers that enable one type of network to interface with another type of network.

In some embodiments the server 120 may analyze the differences in the times of arrival of the lightning EMF resulting from a lightning source, such as lightning source 101, that have been measured and recorded at two or more lightning-detection sensors 110 and multilaterate and/or triangulate the location of the lightning source 101 relative to the two or more lightning-detection sensors 110. In some embodiments the server 120 may receive lightning-EMF data, or data derived from lightning-EMF data from one or more of the lightning-detection sensors 110. A location of each of the lightning-detection sensors 110 may be known at the server 120. For instance, the server 120 may include or have access to a database that identifies each of the lightning-detection sensors 110 and includes Global Positioning System (GPS) location data or other location data of one or more of the lightning-detection sensors 110. In these and other embodiments, the server 120 may geolocate the lightning source 101 using the location of each of the lightning-detection sensors 110 and the time of arrival data of the lightning EMF. In some embodiments, the server 120 may additionally use angle/direction data detected by the lightning-detection sensors 110 to geolocate the lightning source 101, where the angle/direction data indicates an angle and/or direction of the lightning source 101 relative to each corresponding lightning-detection sensor 110. The geolocation of the lightning source 101 may be determined based on lightning EMF arrival times and/or directions at two or more lightning-detection sensors 110. In some embodiments, two, three, or more lightning-detection sensors 110 may be used to uniquely geolocate a lightning source 101 based on a time difference of arrival method ("TDOA") that considers the time of arrival data alone or in combination with angle/direction data.

In some embodiments, the server 120 may include multiple servers 120 in a single lightning-geolocation system 100. In some embodiments, the server 120 may include a cloud server. The server 120 may be located at or near one or more of the lightning-detection sensors 110, or the server 120 may be hundreds of kilometers from any of the lightning-detection sensors 110.

Because the geolocation of a lightning source 101 may be based on the difference between arrival times of lightning EMF at two or more lightning-detection sensors 110, precision in time measurements may, for example, be important to accurate geolocation of a lightning source 101. In some embodiments, the server 120 and at least two of the lightning-detection sensors 110 may have a common time reference point so that the calculation of time differences can be as accurate as possible. In some embodiments, a GPS signal, for example, may be used as the basis for the common time reference point.

As indicated above, the lightning source 101 may include multiple pulses that occur sequentially throughout the duration of the existence of the lightning source. In some cases, the pulses may be relatively close together in time, such as 10-30 µs apart. More generally, pulses that are close together in time may refer to pulses that are separated in time by an amount approximately equal to or less than the EMF propagation time separation of lightning-detection sensors in a lightning-geolocation system. Thus, depending on the separation between lightning-detection sensors and/or other factors, pulses that are considered close together in time may include pulses separated in time by 100, 200, or even 300 µs. In some lightning-geolocation systems, time alignment and subsequent geolocation of such closely spaced pulses of a lightning source may be done efficiently only with dense, and costly, arrays of sensors operating at VHF frequencies. According to embodiments described herein, however, time alignment and geolocation may be accomplished with the lightning-detection sensors 110 which may be separated by several tens to 100s of kilometers (or 100s of µs to 1000s of µs) and which may detect broadband LF to MF signals. Embodiments described herein may identify and align the same pulse of a lightning source as received by different sensors by using one or more waveform features such as described with respect to FIG. 2 that have previously not been used for time alignment and geolocation.

Implementing the lightning-detection sensors 110 as LF-MF lightning-detection sensors may significantly reduce costs compared to other lightning-geolocation systems in which time alignment and subsequent geolocation of closely spaced pulses of a lightning source is done with dense arrays of sensors operating at VHF frequencies for at least two reasons. First, relative to such other lightning-geolocation systems, the lightning-geolocation system 100 may have fewer lightning-detection sensors to cover a given environment such that network maintenance and service costs may be lower. Second, relative to VHF lightning-detection sensors such as may be used in such other lightning-geolocation systems, LF-MF lightning-detection sensors may be much less costly to manufacture, install, and service.

According to some embodiments described herein, data from the lightning-detection sensors 110 may be transmitted to the server 120 by the lightning-detection sensors 110, where the server 120 may perform the time alignment on the data from the lightning-detection sensors followed by geolocating the lightning source based on the time-aligned data. In other embodiments, the lightning detection sensors 110 may transmit data to one of the lightning detection sensors 110 which may perform the time alignment on the data before sending the time-aligned data to the server 120 to perform the geolocation. The entity that performs the time alignment, whether it be the server 120 or one of the lightning-detection sensors 110, may be referred to herein as a time alignment processor.

Figure 2:
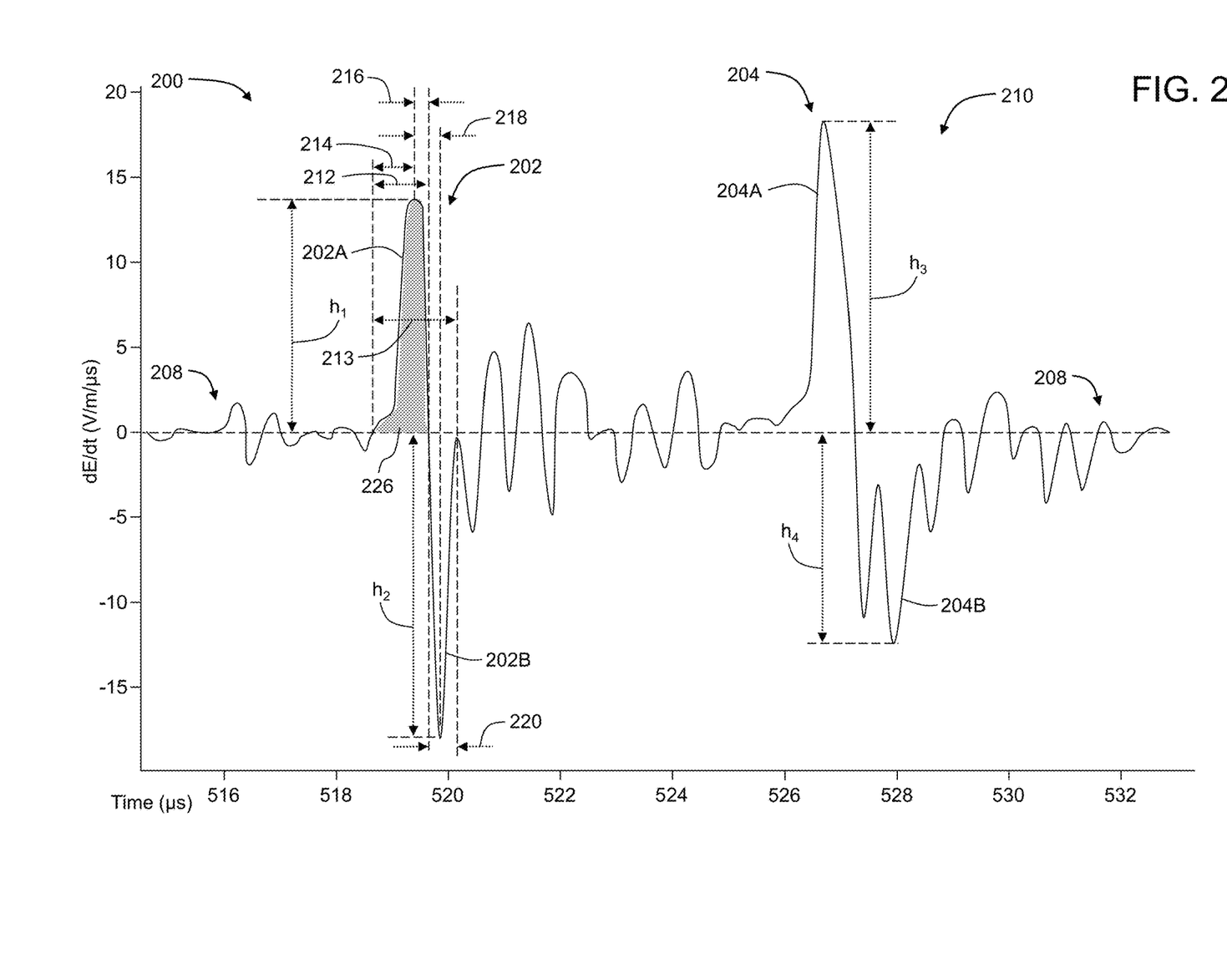
FIG. 2 is a graphical representation of an example EMF data such as may be generated in the lightning-geolocation system of FIG. 1.

FIG. 2 is a graphical representation of an example EMF data 200, arranged in accordance with at least one embodiment described herein. The horizontal axis depicts time; the vertical axis depicts the time derivative of the EMF amplitude (specifically the time derivative of the electric field amplitude) as detected by, e.g., one of the lightning-detection sensors 110. In other embodiments, the EMF amplitude (as opposed to the time derivative of the EMF amplitude) may be measured. Alternatively or additionally, the time derivative of the EMF amplitude may be measured and then integrated to generate the EMF amplitude as a function of time. In the example of FIG. 2, the EMF data 200 includes all data generated by a corresponding lightning-detection sensor over a duration of about 20 µs, including both lightning-EMF data 210 and background EMF data 208. The lightning-EMF data 210 may generally represent lightning EMF from, e.g., the lightning source 101 and may be generated by one of the lightning-detection sensors 110 as part of the lightning-geolocation system 100 as illustrated in FIG. 1. In the example of FIG. 2, the lightning-EMF data 210 may represent lightning EMF of two lightning pulses.

A lightning pulse may be defined in any of a variety of different ways. The definition used may depend on whether the lightning-EMF data represents electric field (E), time derivative of the electric field (dE/dt), magnetic field (B), time derivative of the magnetic field (dB/dt), and/or based on other factors. Accordingly, a lightning pulse may be represented by a unipolar pulse (not shown) or a bipolar pulse as illustrated in FIG. 2. In the example of FIG. 2, for instance, a pulse may be represented as a bipolar pulse that (1) begins and ends at a first threshold, e.g., 0 (or other value) volts per meter per microsecond (V/m/µs), (2) has an initial segment of a first polarity and a second segment with an opposite polarity, each with a peak with an absolute value that exceeds a second threshold (e.g., 7 V/m/µs), and (3) crosses the first threshold between the initial segment and the second segment. The second segment that makes up a bipolar pulse may be referred to as an opposite polarity overshoot. According to the foregoing definition of a pulse, the lightning-EMF data 210 of FIG. 2 includes two bipolar pulses 202 and 204 that represent two lightning pulses. In other embodiments, the first threshold may be different than 0 V/m/µs and/or the second threshold may be different than 7 V/m/µs. Alternatively or additionally, and as already mentioned, "pulse" may be defined the same as or differently than above in other embodiments. For instance, a pulse may be represented as a unipolar pulse that begins and ends at a first threshold (e.g., 0) and has an absolute value that exceeds a second threshold.

Each of the bipolar pulses 202 and 204 includes a positive polarity segment 202A or 204A and a negative polarity segment 202B or 204B. More generally, each of the bipolar pulses 202 and 204 includes an initial segment and an opposite polarity overshoot. In the example of FIG. 2, the initial segment of each of the bipolar pulses 202 and 204 has positive polarity (e.g., is the positive polarity segment 202A or 204A) while the opposite polarity overshoot of each of the bipolar pulses 202 and 204 has negative polarity (e.g., is the negative polarity segment 202B or 204B). In other embodiments, the polarities of the initial segment and opposite polarity overshoots of bipolar pulses may be reversed compared to those shown in FIG. 2.

Each of the positive and negative segments 202A, 204A, 202B, 204B has a corresponding maximum magnitude $h_1$, $h_2$, $h_3$, $h_4$, as illustrated in FIG. 2. The maximum magnitude of the segment may be referred to as the peak of the segment. When describing a pulse peak (or the pulse segment of which it is a part) in relative or comparison terms (e.g., greater than, less than, in excess of, or variations thereof), this may generally refer to the absolute value or magnitude of the pulse peak irrespective of the polarity unless context dictates otherwise.

The lightning-EMF data 210 included in the EMF data 200 has several pulse segments, including the positive polarity segments 202A and 204A and the negative polarity segments 202B and 204B. In some embodiments, pulse segments may generally be defined as segments of the EMF data that (1) have endpoints at a first threshold (e.g., at zero crossings) and (2) have at least one local extrema (e.g., maxima and/or minima or peak) between the endpoints and that exceeds a second threshold. In the example of FIG. 2, for instance, pulse segments may generally be defined as segments of the EMF data 200 between zero crossings that have peaks that exceed in magnitude, e.g., the second threshold (e.g., 7 V/m/µs), or some other threshold. According to the foregoing definition, some pulse segments (e.g., negative segment 204B) may have multiple local extrema, where the "peak" of the pulse segment is considered the local extrema with the greatest magnitude. Pulse segments may be defined in any other suitable manner.

In consideration of the foregoing, various example waveform features of lightning-EMF data 210 that may be used for time alignment of lightning emissions will be described with reference to FIG. 2. One or more of the waveform features may be used as a fingerprint of sorts, or more particularly, as a unique or semi-unique pulse identifier, to time align EMF data collected from different lightning-detection sensors.

Accordingly, FIG. 2 depicts a pulse duration 213, a rise time 214, a peak-to-zero time 216, an initial-peak-to-opposite-peak time 218, an initial segment duration 212, an opposite polarity overshoot duration 220, and an area under a curve of pulse segments between zero crossings 226 (hereinafter "area 226"), each of which is an example of a waveform feature that may be used to time align lightning emissions according to at least one embodiment described herein. Alternatively or additionally, a ratio of the peak of the initial segment to the peak of the opposite polarity overshoot or a ratio of the peak of the opposite polarity overshoot to the peak of the initial segment may be used as a waveform feature or features to time align lightning emissions according to at least one embodiment described herein.

Each of the foregoing waveform features is generally described and/or illustrated in FIG. 2 with respect to the positive polarity segment 202A (and/or with respect to the bipolar pulse 202). More generally, however, embodiments described herein may determine one or more of the foregoing waveform features or analogous waveform features for each and every positive segment, negative segment, bipolar, and/or unipolar pulse in lightning-EMF data generated by a lightning-detection sensor or for some subset of the pulses in the lightning-EMF data generated by the lightning-detection sensor. Alternatively or additionally, the same waveform feature across two or more pulse segments may be averaged to calculate an average waveform feature, which may be used as one or more of the waveform features for time alignment of lightning emissions as described herein.

The pulse duration 213 may be calculated and/or determined as a duration of time from a start time of a lightning pulse to an end time of a lightning pulse. According to the above definition of a lightning pulse, each lightning pulse in the example of FIG. 2 is represented by a bipolar pulse, such as the bipolar pulses 202 and 204. Thus, the pulse duration 213 may be calculated and/or determined as a duration of time from a start time of a bipolar pulse to an end time of a bipolar pulse where the start and end times of the bipolar pulse correspond to zero crossings that bookend the bipolar pulse according to the above definition. Start and end times of lightning pulses defined in other ways may similarly be inherent in the corresponding pulse definition. Alternatively or additionally, the pulse duration of a lightning pulse represented by a unipolar pulse may be calculated and/or determined as a duration of time from a start time of the unipolar pulse to an end time of the unipolar pulse.

The rise time 214 may be calculated and/or determined as a duration of time from a start time of the positive polarity segment 202A to a maximum magnitude time of the positive polarity segment 202A. More generally in the case of a bipolar pulse, the rise time may be calculated and/or determined as the duration of time from the start time of the initial segment (whether of positive or negative polarity) of the bipolar pulse to the maximum magnitude time of the initial segment. More generally still in the case of a unipolar pulse, the rise time may be calculated and/or determined as the duration of time from the start time of the unipolar pulse to the maximum magnitude time of the unipolar pulse. The maximum magnitude time of a pulse or pulse segment may also be referred to as the peak time of the pulse or pulse segment. The start time of a pulse segment may generally refer to a time at which the lightning EMF data 210 crosses a threshold for the last time before reaching a maximum magnitude or peak of the pulse segment (e.g., $h_1$ for the positive polarity segment 202A). The maximum magnitude time of the pulse segment may generally refer to a time at which the pulse segment achieves its maximum magnitude or peak. The threshold for determining the start time includes 0 V/m/μs in the example of FIG. 2, but may more generally include any suitable threshold.

In the example of FIG. 2, the peak-to-zero time 216 may be calculated and/or determined as a duration of time from the maximum magnitude time of the positive polarity segment 202A to a next subsequent zero crossing time of the positive polarity segment 202A. More generally in the case of a bipolar pulse, the peak-to-zero time may be calculated and/or determined as the duration of time from the maximum magnitude time of the initial segment of the bipolar pulse to the next subsequent zero crossing time of the initial segment. More generally still in the case of a unipolar pulse, the peak-to-zero time may be calculated and/or determined as the duration of time from the maximum magnitude time of the unipolar pulse to the next subsequent zero crossing time of the unipolar pulse. The peak-to-zero time may alternatively or additionally be referred to as the fall time. The next subsequent zero crossing time of a pulse segment may generally refer to a first time after the maximum magnitude time of the pulse segment that the lightning-EMF data 210 crosses zero.

The initial-peak-to-opposite peak time 218 may be calculated and/or determined as a duration of time from the maximum magnitude time of the positive polarity segment 202A to a maximum magnitude time of the negative polarity segment 202B within the same bipolar pulse 202. More generally, the initial-peak-to-opposite-peak time 218 may be calculated and/or determined for any bipolar pulse as a duration of time between the peak time of the initial segment of the bipolar pulse and the peak time of the opposite polarity overshoot of the bipolar pulse.

The initial segment duration 212 may be calculated and/or determined as a duration of time from the start time of the positive polarity segment 202A to an end time of the positive polarity segment 202A. More generally, the initial segment duration 212 may be calculated and/or determined as a duration of time from a start time to an end time of the initial segment of a bipolar pulse, whether the initial segment be a positive polarity segment or a negative polarity segment. The end time of a pulse segment may generally refer to a time at which the lightning EMF data 210 crosses a threshold for the first time after reaching the maximum magnitude of the segment. The threshold for determining the end time may be the same as or different than the threshold for determining the start time. In the example of FIG. 2, the threshold for determining the end time is 0 V/m/μs, which is the same threshold for determining the start time. More generally, the threshold for determining the end time may include any suitable threshold.

The opposite polarity overshoot duration 220 may be calculated and/or determined as a duration of time from a start time of the negative polarity segment 202B to an end time of the negative polarity segment 202A. More generally, the opposite polarity overshoot duration 220 may be calculated and/or determined as a duration of time from a start time to an end time of an opposite polarity overshoot of a bipolar pulse, whether the opposite polarity overshoot be a positive polarity segment or a negative polarity segment. In the example of FIG. 2, and similar to the positive polarity segment 202A, the start time and end time of the negative polarity segment 202B are the zero crossing times of the lightning-EMF data 210 respectively before and after the negative polarity segment 202B reaches its maximum magnitude or peak $h_2$.

The area 226 may be calculated and/or determined as, e.g., a definite integral of the lightning-EMF data 210 between the zero crossings as limits of the definite integral. In other embodiments, the area 226 may be calculated and/or determined as a Riemann sum, or according to any other suitable methodology. In the example of FIG. 2, the area is calculated for a single segment of a bipolar pulse. In other embodiments, for a bipolar pulse, the area may be calculated as a sum of the areas under both the initial segment and the opposite polarity overshoot, or as the area under only the opposite polarity overshoot. Alternatively or additionally, for a unipolar pulse, the area may be calculated as the area under the entire unipolar pulse. In these and other embodiments, the area "under" a segment may refer to the area bounded by a line between the zero crossings and by the corresponding segment, whether the segment has positive or negative polarity.

The ratio of initial peak to opposite polarity overshoot may be calculated and/or determined as a ratio of the maximum magnitude of the positive polarity segment 202A to the maximum magnitude of the negative polarity segment 202B, or as $h_1/h_2$ in the example of FIG. 2. The ratio of opposite polarity overshoot to initial peak may be calculated and/or determined as a ratio of the maximum magnitude of the negative polarity segment 202B to the maximum magnitude of the positive polarity segment 202A, or as $h_2/h_1$ in the example of FIG. 2. More generally, for any bipolar pulse, the ratio of initial peak to opposite polarity overshoot may be calculated and/or determined as the ratio of the maximum magnitude of the initial segment of the bipolar pulse to the maximum magnitude of the opposite polarity overshoot of the bipolar pulse, and the ratio of opposite polarity overshoot to initial peak may be calculated and/or determined as a ratio of the maximum magnitude of the opposite polarity overshoot of the bipolar pulse to the maximum magnitude of the initial segment of the bipolar pulse.

One or more of the foregoing waveform features may be extracted from the EMF data 200, and more particularly from the lightning-EMF data 210. For instance, after a corresponding lightning-detection sensor generates the EMF data 200, the lightning-detection sensor may extract one or more of the foregoing waveform features by making calculations and/or determinations based on the EMF data 200 as generally described herein. Additionally or alternatively, the first, second or third time derivatives and/or the first, second, or third time integral of the lightning-EMF data 210 may provide additional waveform features or may provide additional data from which additional waveform features may be extracted.

The waveform features described above are examples and explanatory and should not be interpreted as exclusive or limiting.

Figure 3:
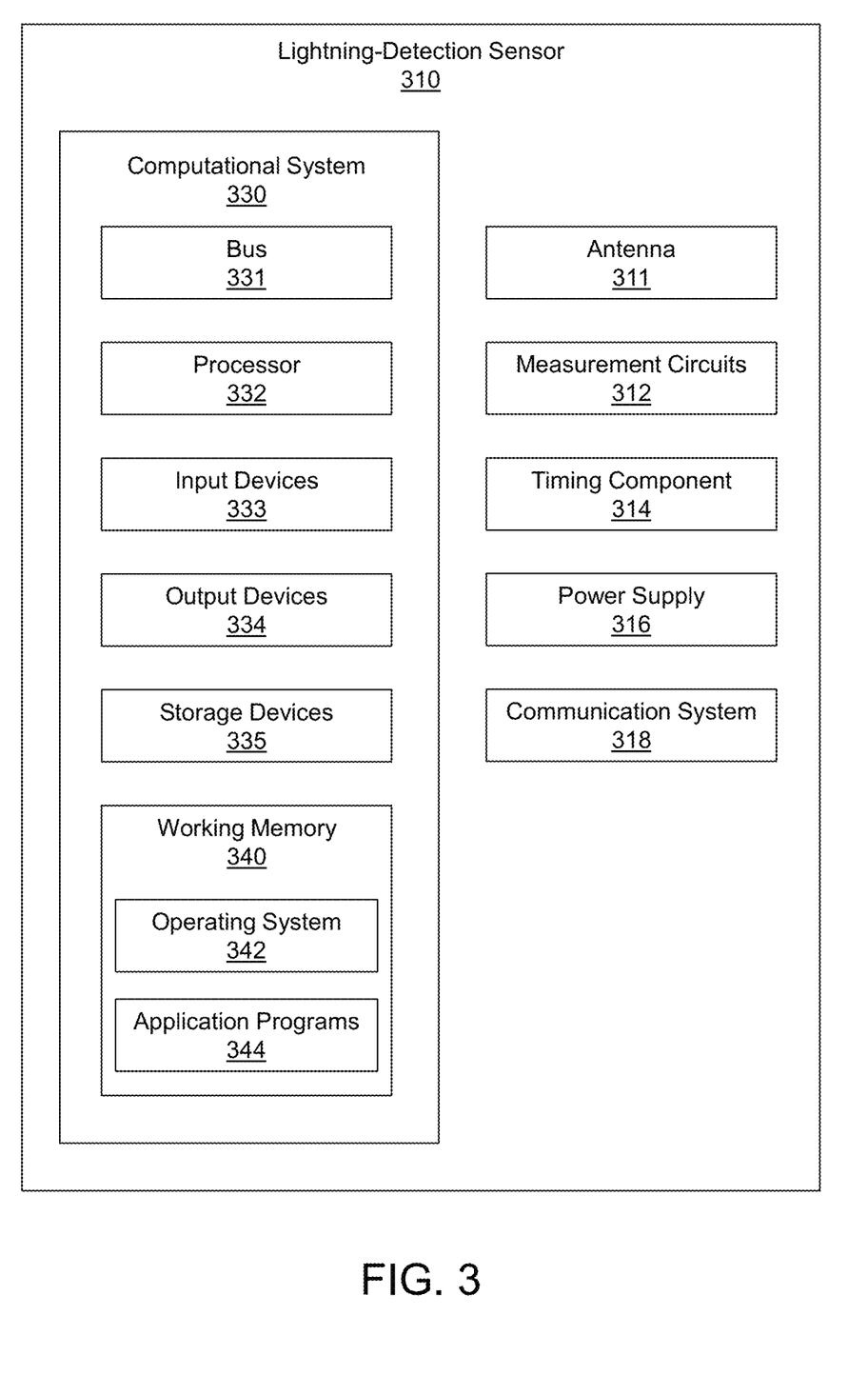
FIG. 3 depicts components of an example lightning-detection sensor such as may be included in the lightning-geolocation system of FIG. 1.

FIG. 3 depicts components of an example lightning-detection sensor 310, arranged in accordance with at least one embodiment described herein. The lightning-detection sensor 310 of FIG. 3 may be analogous to the lightning-detection sensor 110 of the lightning-geolocation system 100 of FIG. 1. In an example implementation, each of the lightning-detection sensors 110 of FIG. 1 may be implemented according to the lightning-detection sensor 310 of FIG. 3.

In at least one embodiment, the lightning-detection sensor 310 may include an antenna 311, one or more measurement circuits 312, a timing component 314, a power supply 316, a communication system 318, and a computational system 330 (or processing unit). Each will be discussed in turn.

In some embodiments the antenna 311 may be configured to detect and/or receive EMF data from the environment and output, e.g., an analog signal representative thereof. In some embodiments the antenna 311 may contain a differential antenna. In some embodiments the antenna 311 may contain a directional element configured to obtain data regarding a direction from which EMF data are received at the antenna 311. The directional element may determine and generate data indicating a primary azimuthal direction corresponding to a lightning source or some other measure of direction.

In some embodiments the measurement circuits 312 may include one or more amplifiers, filters and/or analog-to-digital converters. The amplifiers and filters may be analog or digital. In these or other embodiments the amplification or filtration may be accomplished by hardware or software. In these or other embodiments the measurement circuits 312 may include further signal conditioning and may employ hardware and/or software to accomplish stages of signal conditioning. In some embodiments the measurement circuits 312 may be configured to measure amplitudes and/or polarities of EMF. Additionally or alternatively, the measurement circuits 312 may be configured to measure changes in amplitudes and/or polarities of EMF.

The antenna 311 and/or the measurement circuits 312 may be tuned, designed, and/or configured to receive EMF data in many frequency ranges and/or in particular frequency ranges. Because of the relatively low propagation loss of EMF data at very low frequency (VLF), LF and MF, the antenna 311 and/or the measurement circuits 312 may be tuned or designed to receive EMF at VLF, LF, and/or MF. VLF may include frequencies in the range of 3 kilohertz (kHz) to 30 kHz. LF may include frequencies in the range of 30 kHz to 300 kHz. MF may include frequencies in the range of 300 kHz to 3 MHz. In a particular example implementation, the antenna 311 and/or the measurement circuits 312 may be tuned or designed to receive EMF with an upper limit in a range of 700 kHz to 1 MHz. Additionally or alternatively, the measurement circuits 312 may include one or more high-pass, low-pass, and/or bandpass filters to remove frequencies that are not of interest.

The timing component 314 may be configured to keep and/or receive accurate time measurements, which may be used for, e.g., time synchronization between lightning-detection sensors. In the example of FIG. 1, for instance, each of the lightning-detection sensors 110 may include a timing component such as the timing component 314 to provide time synchronization between the lightning-detection sensors 110. Assuming the lightning-detection sensors 110 are time synchronized and geolocations of the lightning-detection sensors 110 are known, geolocations of lightning sources such as the lightning source 101 of FIG. 1 may be determined, e.g., using a TDOA method or other suitable method based on EMF data generated by the lightning-detection sensors 110.

Returning to FIG. 3, the timing component 314 may include a clock that keeps an accurate time. Additionally or alternatively, the timing component 314 may include a GPS receiver that receives GPS time information from GPS signals which may originate from GPS satellites. Additionally or alternatively, the timing component 314 may include a radio receiver that receives radio transmissions containing time information. Additionally or alternatively the timing component 314 may receive time information from a computer network through radio transmissions or direct physical connection. Additionally or alternatively, the timing component 314 may include a syncing element that syncs the timing component 314 to other lightning-detection sensors 110 or with, e.g., the server 120 shown as part of the lightning-geolocation system 100 in FIG. 1. In some embodiments the timing elements 314 may keep local time, or a national or earth time such as Universal Time Coordinated (UTC). Additionally or alternatively, the timing element 314 may keep relative time, or system time or server time, which may be independent of any local time or earth time.

Generally, the power supply 316 may include any means of providing power to the lightning-detection sensor 310. The power supply 316 may include a battery, or another means of storing power at the lightning-detection sensor 310. Alternatively or additionally the power supply 316 may include a means of generating power at the lightning-detection sensor 310 such as one or more solar cells or wind turbines. In some embodiments the power supply 316 may include a connection to a power grid, such as a direct connection to the power grid.

The communication system 318 may include one or more of a modem, a network card (wireless or wired), an infrared communication device, a wireless communication device, a chipset (such as a Bluetooth® device, a 802.6 device, a WiFi device, a WiMAX device, cellular communication facilities, radio communication device etc.), and/or other suitable communication device. The communications system 318 may permit data to be exchanged with and/or through a network (such as the communication link 112 and/or network of FIG. 1 described above) and/or any other devices described herein. The communication system 318 may be configured for direct communications with a server such as the server 120 of the lightning-geolocation system 100 of FIG. 1. In some embodiments the direct communications may utilize a direct physical connection or a dedicated wireless resource or any other suitable means of direct communications.

The computational system 330 may be used to perform and/or control performance of any of the methods or processes described herein and/or of one or more steps or operations of the methods or operations. For example, the computational system 330 can be used alone or in conjunction with other components. As another example, the computational system 330 can be used to perform any calculation, solve any equation, perform any identification, and/or make any determination described herein.

In some embodiments the computational system 330 may include any or all of the hardware elements shown in FIG. 3 and described herein, such as one or more of a bus 331, one or more processors 332, one or more input devices 333, one or more output devices 334, one or more storage devices 335, and/or working memory 340. Hardware elements of the computational system 330 can be electrically coupled via the bus 331 (or may otherwise be in communication, as appropriate).

The one or more processors 332 can include one or more general-purpose processors and/or one or more special-purpose processors (such as digital signal processing chips, graphics acceleration chips, and/or the like), or other suitable processors.

The one or more input devices 333 can include a mouse, a keyboard, a touch screen, such as a capacitive touch screen, and/or other suitable input device.

The one or more output devices 334 can include a display device, a printer, a speaker, and/or other suitable output device.

The one or more storage devices 335 can include local and/or network-accessible storage and/or can include a disk drive, a drive array, an optical storage device, a solid-state storage device, such as random access memory ("RAM") and/or read-only memory ("ROM"), which can be programmable and/or flash-updateable.

The working memory 340 can include a RAM or ROM device.

In some embodiments the computational system 330 may also include one or more software elements, illustrated in FIG. 3 as being located within the working memory 340. The software elements may include an operating system 342 and/or other code, such as one or more application programs 344. The one or more application programs 344 may include computer-readable instructions executable by processors, such as the one or more processors 332, to perform or control performance of one or more methods, processes, steps, and/or operations described herein. For example, one or more steps and/or operations described with respect to the method(s) of FIGS. 5, 6, and/or 7 and/or other method(s) discussed herein might be implemented as code and/or instructions executable by a computer (and/or a processor within a computer). In some embodiments a set of these instructions and/or codes might be stored on a computer-readable storage medium, such as the storage device(s) 335 of FIG. 3.

In some cases, the storage medium might be incorporated within the computational system 330 as illustrated in FIG. 3, or in communication with the computational system 330. In other embodiments, the storage medium might be separate from the computational system 330 (e.g., as a removable medium, such as a compact disc, etc.), and/or provided in an installation package, such that the storage medium can be used to program a general-purpose computer with the instructions/code stored thereon. These instructions might take the form of executable code, which is executable by the computational system 330 and/or might take the form of source and/or installable code, which, upon compilation and/or installation on the computational system 330 (e.g., using any of a variety of generally available compilers, installation programs, compression/decompression utilities, etc.), then takes the form of executable code.

Figure 4:
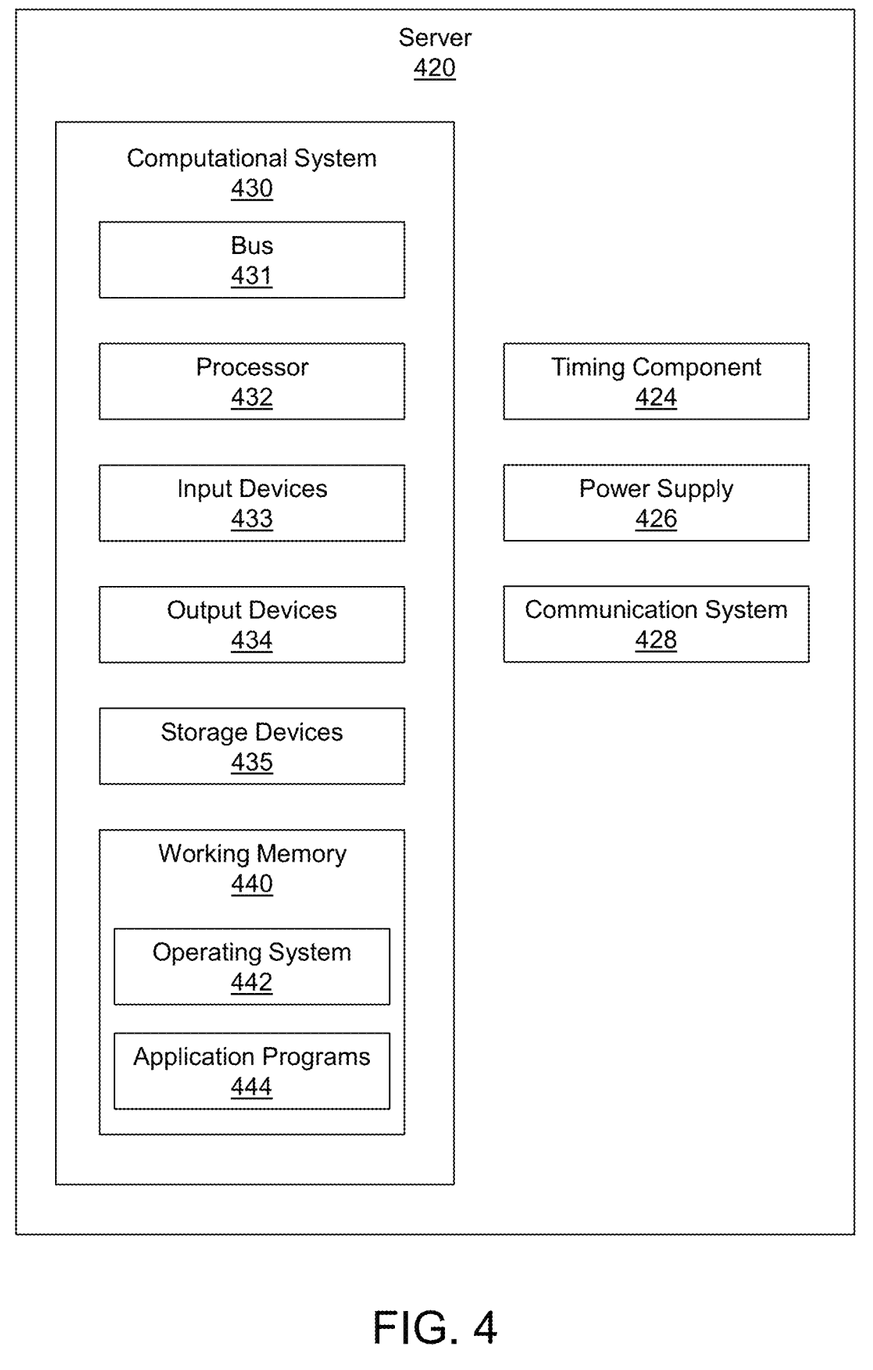
FIG. 4 depicts components of an example server such as may be included in the lightning-geolocation system of FIG. 1.

FIG. 4 depicts components of an example server 420, arranged in accordance with at least one embodiment described herein. The server 420 of FIG. 4 may be analogous to the server 120 of the lightning-geolocation system 100 of FIG. 1. In an example implementation, the server 120 of FIG. 1 may be implemented according to the server 420 of FIG. 4.

In at least one embodiment, the server 420 may include a timing component 424, a power supply 426, a communication system 428, and a computational system 430 (or processing unit). Each will be discussed in turn.

The timing component 424 may be configured to keep and/or receive accurate time measurements. The timing component 424 may include a clock that keeps an accurate time. Additionally or alternatively, the timing component 424 may include a GPS receiver that receives GPS time information from GPS signals which may originate from GPS satellites. Additionally or alternatively, the timing component 424 may include a radio receiver that receives radio transmissions containing time information. Additionally or alternatively the timing component 424 may receive time information from a computer network through radio transmissions or direct physical connection. Additionally or alternatively, the timing component 424 may include a syncing element that syncs the timing component 424 to the lightning-detection sensor 310 of FIG. 3, the lightning-detection sensors 110 of FIG. 1, and/or with other server. In some embodiments the timing component 424 may keep local time, or a national or earth time such as UTC. Additionally or alternatively, the timing component 424 may keep relative time, or system time or server time, which may be independent of any local time or any other earth time.

Generally, the power supply 426 may include any means of providing power to the server 420. The power supply 426 may include a battery, or another means of storing power at the server. Additionally or alternatively the power supply 426 may include a means of generating power at the server such as one or more solar cells or wind turbines. In some embodiments the power supply 426 may include a connection to a power grid, such as a direct connection to the power grid.

The communication system 428 may include one or more of a modem, a network card (wireless or wired), an infrared communication device, a wireless communication device, a chipset (such as a Bluetooth® device, a 802.6 device, a WiFi device, a WiMAX device, cellular communication facilities, radio communication device etc.), and/or other suitable communication device. The communications system 428 may permit data to be exchanged with and/or through a network (such as the communication link 112 and/or network of FIG. 1 described above) and/or any other devices described herein. The communication system 428 may be configured for direct communications with one or more sensors such as the lightning-detection sensor 310 of FIG. 3 and/or the lightning-detection sensors 110 of the lightning-geolocation system 100 of FIG. 1. In some embodiments the direct communications may utilize a direct physical connection or a dedicated wireless resource or any other suitable means of direct communications. In some embodiments the communication system 428 may be designed or configured to receive communications from two or more of the lightning-detection sensor 310 of FIG. 3 and/or the lightning-detection sensors 110 of FIG. 1 simultaneously.

The computational system 430 may be used to perform and/or control performance of any of the methods or processes described herein and/or one or more steps or operations of the methods or operations. For example, the computational system 430 can be used alone or in conjunction with other components. As another example, the computational system 430 can be used to perform any calculation, solve any equation, perform any identification, and/or make any determination described herein.

In some embodiments the computational system 430 may include any or all of the hardware elements shown in FIG.

4 and described herein, such as one or more of a bus 431, one or more processors 432, one or more input devices 433, one or more output devices 434, one or more storage devices 435, and/or working memory 440. Hardware elements of the computational system 430 can be electrically coupled via the bus 431 (or may otherwise be in communication, as appropriate).

The one or more processors 432 can include one or more general-purpose processors and/or one or more special-purpose processors (such as digital signal processing chips, graphics acceleration chips, and/or the like), or other suitable processors.

The one or more input devices 433 can include a mouse, a keyboard, a touch screen, such as a capacitive touch screen, and/or other suitable input device.

The one or more output devices 434 can include a display device, a printer, a speaker, and/or other suitable output device.

The one or more storage devices 435 can include local and/or network-accessible storage and/or can include a disk drive, a drive array, an optical storage device, a solid-state storage device, such as RAM and/or ROM, which can be programmable, and/or flash-updateable.

The working memory 440 can include a RAM or ROM device.

In some embodiments the computational system 430 may also include one or more software elements, illustrated in FIG. 4 as being located within the working memory 440. The software elements may include an operating system 442 and/or other code, such as one or more application programs 444. The one or more application programs 444 may include computer-readable instructions executable by processors, such as the one or more processors 432, to perform or control performance of one or more methods, processes, steps, and/or operations described herein. For example, one or more steps and/or operations described with respect to the method(s) of FIGS. 5, 6, and/or 7 and/or other method(s) discussed herein might be implemented as code and/or instructions executable by a computer (and/or a processor within a computer). In some embodiments a set of these instructions and/or codes might be stored on a computer-readable storage medium, such as the storage device(s) 435 of FIG. 4.

In some cases, the storage medium might be incorporated within the computational system 430 as illustrated in FIG. 4, or in communication with the computational system 430. In other embodiments, the storage medium might be separate from the computational system 430 (e.g., as a removable medium, such as a compact disc, etc.), and/or provided in an installation package, such that the storage medium can be used to program a general-purpose computer with the instructions/code stored thereon. These instructions might take the form of executable code, which is executable by the computational system 430 and/or might take the form of source and/or installable code, which, upon compilation and/or installation on the computational system 430 (e.g., using any of a variety of generally available compilers, installation programs, compression/decompression utilities, etc.), then takes the form of executable code.

Figure 5:
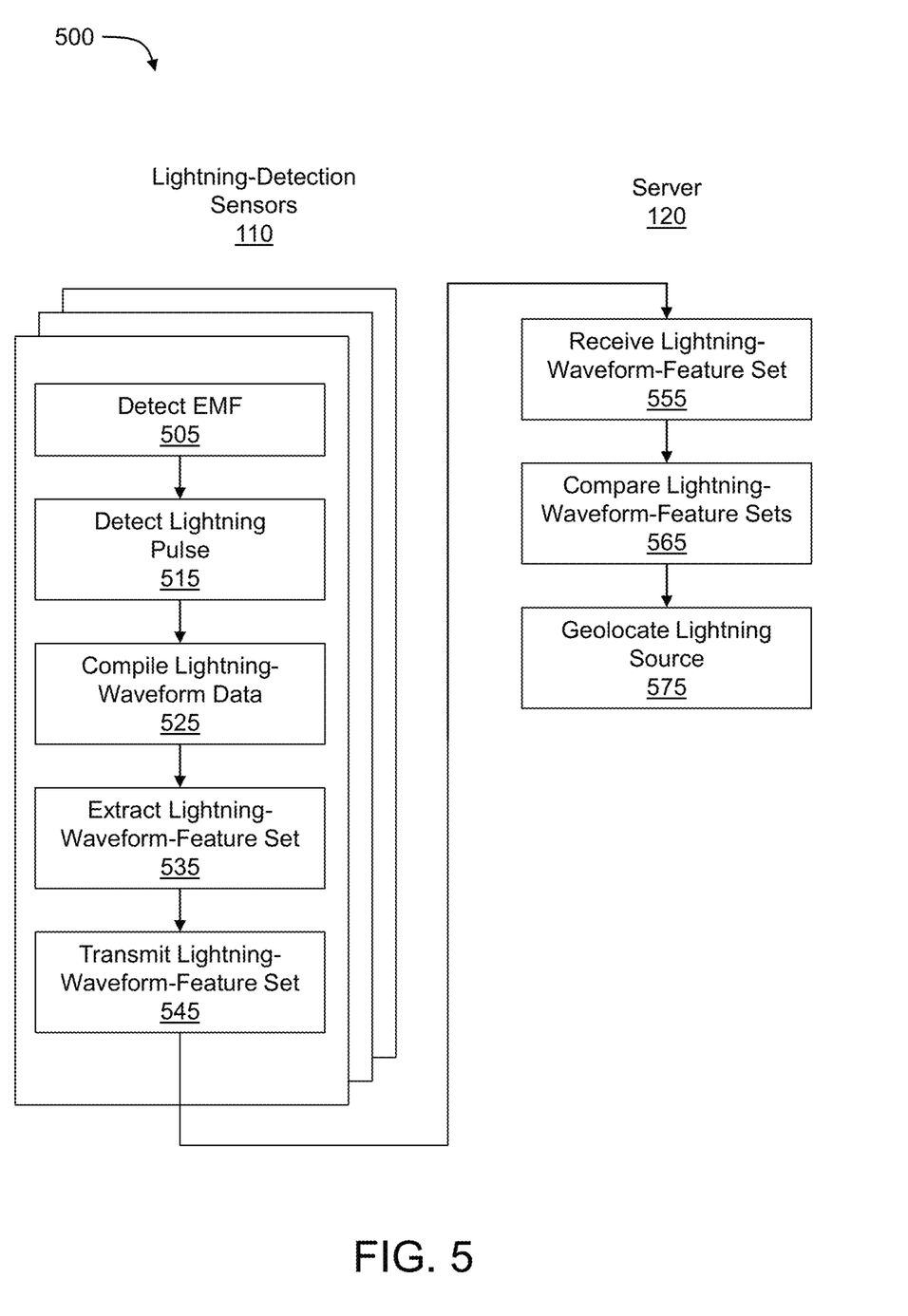
FIG. 5 is a system level flowchart of an example method for lightning geolocation

FIG. 5 is a system level flowchart of an example method 500 for lightning geolocation, arranged in accordance with at least one embodiment described herein. One or more steps, blocks, and/or operations of the method 500 may be implemented, in some embodiments, by one or more components of the lightning-geolocation system 100 of FIG. 1, as denoted by headers "Lightning-Detection Sensors 110" and "Server 120" in FIG. 5. The division of the steps, blocks, and/or operations of FIG. 5 between the lightning-detection sensors 110 and the server 120 is provided by way of example only and in other embodiments, one or more of the steps, blocks, and/or operations illustrated in FIG. 5 as being performed by the lightning-detection sensors 110 may instead be performed by the server 120. Alternatively or additionally, one or more of the steps, blocks, and/or operations illustrated in FIG. 5 as being performed by the server 120 may instead be performed by the lightning-detection sensors 110. Although illustrated as discrete blocks, various blocks may be divided into additional blocks, combined into fewer blocks, or eliminated, depending on the desired implementation. The method 500 may begin at block 505.

At block 505, EMF may be detected in an environment ("Detect EMF"). EMF detection at block 505 may include any suitable process for detecting EMF (including EMF amplitude, a time derivative of the EMF amplitude, or other measure of the EMF) in the environment. For instance, EMF detection at block 505 may include detecting and/or measuring EMF in the environment, and/or generating and recording EMF data that represents the EMF in the environment. Block 505 may be followed by block 515.

Block 515 may include detecting one or more lightning pulses emitted by a lightning source ("Detect Lightning Pulse" in FIG. 5). Detecting a lightning pulse may generally include determining whether EMF data from block 505 represents one or more lightning pulses. For example, detecting a lightning pulse may include determining that the EMF data from block 505 exceeds a threshold indicative of a lightning pulse. Referring to FIG. 2, for instance, one or more lightning pulses may be detected where it is determined that the EMF data 200 exceeds a threshold of 7 V/m/µs magnitude (or other threshold) for either or both polarity segments of either or both of the bipolar pulses 202 and 204. More generally, one or more lightning pulses may be detected where it is determined that EMF data exceeds a suitable threshold to indicate a bipolar pulse or a unipolar pulse, as the case may be. In these and other embodiments, the lightning-detection sensors 110 may implement an interrupt-driven scheme to report lightning waveform feature sets to the server 120 to conserve power and/or communication resources of the lightning-detection sensors 110. For instance, the lightning-detection sensors 110 may report lightning waveform feature sets to the server 120 only after detecting a lightning pulse, e.g., at block 515 in FIG. 5, after which one or more lightning waveform feature sets for the detected lightning pulse may be reported to the server 120 as described in more detail below. Alternatively or additionally, the lightning-detection sensors 110 may periodically or randomly or according to some other timing send a status or "heartbeat" message to the server 120 that confirms to the server 120 that the corresponding lightning-detection sensor 110 is on and functioning. Block 515 may be followed by block 525.

Block 525 may include compiling data regarding a waveform of a lightning pulse or pulses ("Compile Lightning-Waveform Data"). Compiling lightning-waveform data may include compiling EMF data detected at block 505, into data regarding a lightning waveform, already referred to herein as "lightning-waveform data." Lightning-waveform data (also referred to as lightning-EMF data in the discussion above of FIG. 2) may include EMF data representative of the one or more lightning pulses detected at block 515. Compilation of the lightning-waveform data at block 525 may seek to exclude background EMF data from the lightning-waveform data. Block 525 may be followed by block 535.

Block 535 may include extracting one or more sets of waveform features from the lightning-waveform data ("Extract Lightning-Waveform-Feature Set"). Extracting the lightning-waveform-feature set from the lightning-waveform data at block 535 may include extracting and recording waveform features ("lightning-waveform features") from the lightning-waveform data of block 525 in a set of one or more lightning-waveform features. In an example embodiment, extracting the lightning-waveform features from the lightning-waveform data of block 525 may include analyzing the lightning-waveform data of block 525 to calculate and/or determine one or more of the waveform features discussed in the context of, e.g., FIG. 2. Block 535 may be followed by block 545.

Block 545 may include transmitting the lightning-waveform-feature set ("Transmit Lightning-Waveform-Feature Set"). Transmitting the lightning-waveform-feature set may include transmitting the lightning-waveform-feature set from the corresponding lightning-detection sensor 110 to the server 120. Block 545 may be followed by block 555.

Block 555 may include receiving the lightning-waveform-feature set ("Receive Lightning-Waveform-Feature Set"). Receiving the lightning-waveform-feature set may include receiving at the server 120 the lightning-waveform-feature set transmitted by the corresponding lightning-detection sensor 110 at block 545. In some embodiments, the server 120 may receive multiple lightning-waveform-feature sets from multiple lightning-detection sensors 110, all representative of the same one or more lightning pulses generated by the same lightning source. Block 555 may be followed by block 565.

Block 565 may include comparing and time-aligning lightning-waveform-feature sets from two or more of the lightning-detection sensors 110 ("Compare Lightning-Waveform-Feature Sets"). In this and other embodiments, an approximate time alignment can be performed initially for two or more lightning-waveform-feature sets based on absolute time (e.g., generated by a timing component) and a spatial reference for each lightning-detection sensor 110 (e.g., known geolocation), both of which may be included in the corresponding lightning-waveform-feature set. After the approximate time alignment, embodiments described herein may compare and time-align the lightning-waveform-feature sets more precisely by, e.g., comparing pairs of waveform features from two lightning-waveform-feature sets sequentially and advancing or delaying in time one of the lightning-waveform-feature sets relative to the other until the pairs of sequentially compared waveform features match or substantially match.

A pair of waveform features from two lightning-waveform-feature sets may be said to match or substantially match according to some embodiments if a waveform feature from one of the lightning-waveform-feature sets is within a threshold range from the waveform feature in the other lightning-waveform-feature sets. The threshold range may be 15%, 10%, or even 5% in some embodiments. For instance, assume a first lightning-waveform-feature set $S_1$ includes various sequential rise times of, among others, 0.71 μs, 0.84 μs, and 0.59 μs and that a second lightning-waveform-feature set $S_2$ includes various sequential rise times of, among others, 0.69 μs, 0.81 μs, and 0.57 μs. Further assume that the initial approximate time alignment results in the first lightning-waveform-feature set $S_1$ and the second lightning-waveform-feature set $S_2$ being time aligned as indicated in Table 1. In Table 1 (and Table 2 below), ellipses (" . . . ") indicate additional unspecified rise times.

TABLE 1

| Initial Approximate Time Alignment | |
|---|---|
| Lightning-Waveform-Feature Set $S_1$ | Lightning-Waveform-Feature Set $S_2$ |
| . . . | . . . |
| . . . | 0.69 μs |
| 0.71 μs | 0.81 μs |
| 0.84 μs | 0.57 μs |
| 0.59 μs | . . . |
| . . . | . . . |

A comparison of the pairs of rise times of the first and second lightning-waveform-feature sets $S_1$ and $S_2$ based on the initial approximate time alignment of Table 1 reveals a time misalignment since the 0.71 μs and 0.84 μs rise times of the first lightning-waveform-feature set $S_1$ respectively do not match or substantially match (assuming threshold range of 5%) the 0.81 μs and 0.57 μs rise times of the second lightning-waveform-feature set $S_2$. Accordingly, the first lightning-waveform-feature set $S_1$ may be delayed in time relative to the second lightning-waveform-feature set $S_2$, or the second lightning-waveform-feature set $S_2$ may be advanced in time relative to the first lightning-waveform-feature set $S_1$ to time align the first and second lightning-waveform-feature sets as indicated in Table 2.

TABLE 2

| Refined Time Alignment | |
|---|---|
| Lightning-Waveform-Feature Set $S_1$ | Lightning-Waveform-Feature Set $S_2$ |
| . . . | . . . |
| 0.71 μs | 0.69 μs |
| 0.84 μs | 0.81 μs |
| 0.59 μs | 0.57 μs |
| . . . | . . . |

A comparison of the pairs of rise times of the first and second lightning-waveform-feature sets $S_1$ and $S_2$ based on the refined time alignment of Table 2 reveals a time alignment since the 0.71 μs, the 0.84 μs, and the 0.59 μs rise times of the first lightning-waveform-feature set $S_1$ respectively match or substantially match (assuming threshold range of 5%) the 0.69 μs, the 0.81 μs, and the 0.57 μs rise times of the second lightning-waveform-feature set $S_2$. In other embodiments, one or more other waveform features instead of or in addition to rise times and discussed in connection with FIG. 2 may be used for the time alignment discussed with respect to Tables 1 and 2. Block 565 may be followed by block 575.

The foregoing example assumes a comparison and time alignment process for block 565 involving relatively simple matching of features from different lightning-waveform-feature sets. In other embodiments, comparing and time aligning lightning-waveform-feature sets at block 565 may be different and/or more complex than in the foregoing example. For instance, block 565 may include an algorithmic approach based on multiple linear regression, machine learning, or other suitable algorithmic approach that uses a single type of waveform feature from multiple lightning-waveform-feature sets (as in the foregoing example) or multiple different types of waveform features from multiple lightning-waveform-feature sets. Alternatively or additionally, block 565 may implement a logistic regression approach with the waveform features assigning different weights to each based upon their efficacy.

Block 575 may include geolocating one or more lightning sources ("Geolocate Lightning Source"). In general, geolocating the one or more lightning sources may be based on the results of comparing and time-aligning the lightning-waveform-feature sets at block 565. For example, time-aligned lightning-waveform-feature sets from two or more lightning-detection sensors 110 may be used to determine a geolocation of each of one or more lightning sources that generated the one or more lightning pulses represented by each of the lightning-waveform-feature sets using a TDOA method or other suitable method to geolocate the lightning event. Additional details regarding examples of how to geolocate one or more lightning sources based on such lightning-waveform-feature sets are disclosed in Nag, A., M. J. Murphy, W. Schulz, and K. L. Cummins: Lightning locating systems: Insights on characteristics and validation techniques, Earth Space Sci., vol. 2, issue 4, pages 65-93, April 2015. The foregoing publication is incorporated herein by reference in its entirety In some embodiments, detecting EMF at block 505 may occur at the Nyquist frequency (e.g., 0.5× maximum desired bandwidth). In some embodiments, detecting the EMF at block 505 may further include signal conditioning steps including one or more of amplification, filtration, quantization, or analog-to-digital conversion. The signal conditioning may be accomplished by hardware or software or both. In some embodiments EMF detection at block 505 may further include storing measurements of the detected EMF as the EMF data for further analysis.

In some embodiments, determining lightning events at block 515, compiling lightning-waveform data at block 525, and/or extracting lightning-waveform-feature sets at block 535 may include analyzing and/or processing the EMF data to identify in the EMF data one or more pulse segments, a start time of one or more of the pulse segments, an end time of one or more of the pulse segments, a maximum magnitude or peak of one or more of the pulse segments, a maximum magnitude time of one or more of the pulse segments, or other information that may be used to extract the waveform features included in the lightning-waveform-feature set. In these and other embodiments, the EMF data may include timestamps for some or all of its data points or may otherwise associate specific times with specific data points. The timestamps may be used to time align different lightning-waveform-feature sets. As described above, for instance, if pairs of waveform features from different lightning-waveform-feature sets do not match or substantially match, one of the lightning-waveform-feature sets may be delayed or advanced in time relative to the other where the time stamps provide context for the advancement or delay.

Determining a lightning event at block 515 may include determining whether the EMF data exceeds a threshold, as already described above. Alternatively or additionally, determining a lightning event at block 515 may be based on one or more other criteria. Where a threshold is used, the threshold may be constant or may be variable based on, e.g., a region in which the lightning-detection sensor is deployed or other factors. Determining that a lightning event has occurred at block 515 may be based on the EMF data satisfying a single criterion, any one of multiple criteria, or each and every one of multiple criteria.

The lightning-waveform data generated at block 525 may include amplitude data, polarity data, and/or time data. The lightning-waveform data may include EMF data representing a lightning event as determined at block 515. The lightning-waveform data may include timestamp data corresponding to samples of the lightning-waveform data. Additionally or alternatively, the lightning-waveform data may include a timestamp for some, but not all of the samples, such as for a first and/or a last sample. The sampling rate of the lightning-waveform data may be known, and thus the timestamp of each sample may be attainable from the timestamp of any one sample.

The lightning-waveform-feature set extracted at block 535 may include time-based calculations of waveform features discussed with respect to FIG. 2, such as pulse duration, rise time, peak-to-zero time, initial-peak-to-opposite-peak time, initial segment duration, opposite polarity overshoot duration, and/or time measurements associated with each of the foregoing (e.g., a start time, end time, maximum magnitude time, or other time measurement). Additionally or alternatively, the lightning-waveform-feature set may include ratios, such as the ratio of the peak of the initial segment to the peak of the opposite polarity overshoot or the ratio of the peak of the opposite polarity overshoot to the peak of the initial segment. Additionally or alternatively, the lightning-waveform-feature set extracted at block 535 may include calculations of the area under the curve of pulse segments between zero-crossings, direction data, or other data.

In some embodiments extracting the lightning-waveform-feature-sets at block 535 may select certain waveform features to be included in every lightning-waveform-feature set. For example, block 535 may include extracting area under the curve of pulse segments between zero-crossings in every lightning-waveform-feature set. Additionally or alternatively, extracting the lightning-waveform-feature sets at block 535 may select which waveform features to include in a given lightning-waveform-feature set based on historical data representing lightning pulses generated by lightning sources. Additionally or alternatively, extracting the lightning-waveform-feature sets at block 535 may determine which waveform features to include in the lightning-waveform-feature set based on a comparison with other lightning-waveform-feature sets.

Transmitting lightning-waveform-feature sets at block 545 may include encoding each lightning-waveform-feature set, ordering lightning-waveform features of each lightning-waveform-feature set in a specific order for transmission, including a label or header identifying which specific lightning-waveform features of each lightning-waveform-feature set are being included in the transmission, or in which order they are being transmitted, and/or rounding, truncating, or quantization of values. Transmitting each lightning-waveform-feature set at block 545 may include transmitting data representing each lightning-waveform-feature set using, e.g., the communication link 112 and/or network of FIG. 1. In addition to the examples provided above, the communication link 112 and/or network of FIG. 1 may alternatively or additionally include direct radio wave communication, a radio access communication network such as a Long Term Evolution (LTE) network or Long Term Evolution Advanced (LTE-A) network, a wired connection, or other suitable network or technology. Transmitting each lightning-waveform-feature set may alternatively or additionally include transmitting identifier information identifying the lightning-detection sensor that transmitted the lightning-waveform-feature set, location information identifying the location of the lightning-detection sensor that transmitted the lightning-waveform-feature set, and/or other information.

In some embodiments the lightning-detection sensor may transmit lightning-waveform data to the server 120 in addition to transmitting lightning-waveform-feature sets. In these or other embodiments the transmission of lightning-waveform data may be delayed. In these or other embodiments the delay may be based on one or more of network availability or latency.

Receiving the lightning-waveform-feature set at block 555 may include decoding the received data, including decoding headers or ordering information that correlates waveform features with order in the transmitted data. In some embodiments, receiving the lightning-waveform-feature set at block 555 may include and/or be followed by decoding the received signal and reconstructing the data as it was before encoding and transmission.

In some embodiments, the method 500 may additionally include, after receiving the lightning-waveform-feature set at block 555, caching features and/or sets of features of lightning waveforms in a cache or temporary memory. The cache or other temporary memory may make recently received lightning-waveform-feature sets readily available for further processing (e.g., comparison at block 565).

The comparing of lightning-waveform-feature sets at block 565 may compare multiple instances of the same type of waveform feature, multiple different types of waveform features, or any combination thereof. For instance, multiple different opposite polarity overshoot durations in one lightning-waveform-feature set may be compared to multiple different opposite polarity overshoot durations in a different lightning-waveform-feature set. Alternatively or additionally, e.g., one or more pulse durations, one or more peak-to-zero times, and one or more areas under curves of pulse segments between zero crossings in one lightning-waveform-feature set may be respectively compared to one or more pulse durations, one or more peak-to-zero times, and one or more areas under curves of pulse segments between zero crossings in a different lightning-waveform-feature set.

Geolocating each lightning source at block 575 may use multilateral on or a similar method, such as a triangulation, which may involve a TDOA calculation to geolocate each lightning source. Geolocating each lightning source at block 575 may be performed in response to, e.g., a determination that the lightning-waveform-feature sets are time aligned after block 565.

In some embodiments geolocating each lightning source at block 575 may be based on known locations of each of the lightning-detection sensors 110 from which a corresponding lightning-waveform-feature set is received. The server 120 may obtain data including the location of each of the lightning-detection sensors 110 from a database at or near the server, from a network of computers, such as the Internet, and/or directly from the lightning-detection sensors 110 themselves.

Although not illustrated in FIG. 5, the method 500 may further include storing time aligned lightning-waveform-feature sets, geolocations of lightning sources, or other data received from the lightning-detection sensors or derived therefrom in long-term data storage, such as the storage devices 435 of FIG. 4.

The term "substantially" means within 5% or 10% of the value referred to or within manufacturing tolerances unless otherwise specified.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce altera- That which is claimed is:

1. A method to generate data to geolocate one or more lightning sources that generate electromagnetic field (EMF) emissions in the form of lightning pulses, the method comprising:
    detecting in an environment the plurality of lightning pulses that are close together in time;
    producing lightning-EMF data from the detected plurality of lightning pulses, the lightning-EMF data representing the plurality of lightning pulses;
    extracting a lightning-waveform-feature set from the lightning-EMF data, including extracting two or more waveform features for each of the plurality of lightning pulses from the lightning-EMF data, including:
        analyzing the lightning-EMF data to identify a plurality of pulse segments in the lightning EMF data, each of the plurality of pulse segments representing at least a portion of a different one of the plurality of lightning pulses;
        calculating a rise time for each of the plurality of pulse segments; and
        calculating a peak-to-zero time for each of the plurality of pulse segments, wherein the two or more waveform features for each of the plurality of lightning pulses includes a corresponding rise time and a corresponding peak-to-zero time; and
    transmitting the extracted lightning-waveform-feature set that includes both the rise time and the peak-to-zero time for each of the plurality of lightning pulses that are close together in time to a time alignment processor to perform time alignment on a plurality of extracted lightning-waveform-feature sets received from a plurality of lightning-detection sensors and to geolocate the one or more lightning sources based on the time-aligned plurality of extracted lightning-waveform-feature sets.

2. The method of claim 1, wherein extracting the two or more waveform features for each of the plurality of lightning pulses further includes for each of the plurality of lightning pulses, calculating a pulse duration as a duration of time of a corresponding one of the plurality of pulse segments, wherein the two or more waveform features for each of the plurality of lightning pulses further includes a corresponding pulse duration.

3. The method of claim 1, wherein detecting the plurality of lightning pulses that are close together in time comprises detecting a sequence of lightning pulses where sequential lightning pulses of the sequence are separated in time by an amount equal to or less than an electromagnetic field (EMF) propagation time separation of lightning-detection sensors in a lightning-geolocation system.

4. The method of claim 1, wherein detecting the plurality of lightning pulses that are close together in time comprises detecting a sequence of lightning pulses where sequential lightning pulses of the sequence are separated in time by an amount equal to or less than 30 microseconds.

5. The method of claim 1, wherein extracting the two or more waveform features for each of the plurality of lightning pulses further includes:
    analyzing the lightning-EMF data to identify a plurality of bipolar pulses in the lightning EMF data, each of the plurality of bipolar pulses representing a different one of the plurality of lightning pulses and each of the plurality of bipolar pulses including an initial segment and an opposite polarity overshoot, each of the initial segment and the opposite polarity overshoot included in the plurality of pulse segments; and
    for each of the plurality of bipolar lightning pulses, calculating an initial-peak-to-opposite-peak time as a duration of time between a peak magnitude of the initial segment and a peak magnitude of a corresponding opposite polarity overshoot of the corresponding bipolar pulse, wherein the two or more waveform features for each of the plurality of lightning pulses further includes a corresponding initial-peak-to-opposite-peak time.

6. The method of claim 1, wherein extracting the two or more waveform features for each of the plurality of lightning pulses further includes:
    analyzing the lightning-EMF data to identify a plurality of bipolar pulses in the lightning EMF data made up of the plurality of pulse segments, each of the plurality of bipolar pulses representing a different one of the plurality of lightning pulses; and
    for each of the plurality of bipolar lightning pulses represented by a corresponding one of the plurality of bipolar pulses, calculating at least one of an initial segment duration or an opposite polarity overshoot duration, wherein the two or more waveform features for each of the plurality of lightning pulses further includes at least one of a corresponding initial segment duration or a corresponding opposite polarity overshoot duration.

7. The method of claim 1, wherein extracting the two or more waveform features for each of the plurality of lightning pulses includes:
    analyzing the lightning-EMF data to identify a plurality of bipolar pulses in the lightning EMF data, each of the plurality of bipolar pulses representing a different one of the plurality of lightning pulses and each of the plurality of bipolar pulses including an initial segment of a first polarity and an opposite polarity overshoot of a second polarity opposite the first polarity, each of the initial segment and the opposite polarity overshoot included in the plurality of pulse segments; and
    for each of the plurality of bipolar lightning pulses, calculating at least one of a first ratio of peak magnitude of the initial segment to peak magnitude of the opposite polarity overshoot or a second ratio of peak magnitude of the opposite polarity overshoot to peak magnitude of the initial segment, wherein the two or more waveform features for each of the plurality of lightning pulses further includes at least one of a corresponding first ratio or a corresponding second ratio.

8. The method of claim 1, wherein extracting the two or more waveform features for each of the plurality of lightning pulses further includes calculating an area under a curve of pulse segments between zero crossings for each of the plurality of pulse segments, wherein the two or more waveform features for each of the plurality of lightning pulses further includes a corresponding area under a curve of pulse segments between zero crossings.

9. The method of claim 1, wherein detecting the plurality of lightning pulses comprises detecting the plurality of lightning pulses in a low frequency ("LF") to medium frequency ("MF") range.

10. The method of claim 1, further comprising, prior to the extracting, determining occurrence of the plurality of lightning pulses from the lightning-EMF data.

11. The method of claim 1, wherein at least some of the plurality of lightning pulses are separated in time by less than 300 microseconds.

12. A non-transitory computer-readable medium having computer-readable instructions stored thereon executable by a processor device to perform or control performance of the method of claim 1.

13. A method to geolocate a plurality of lightning pulses, the method comprising:
  receiving a plurality of lightning-waveform-feature sets from a plurality of lightning-detection sensors, each of the plurality of lightning-waveform-feature sets including at least rise time and peak-to-zero time waveform features for each of a plurality of lightning pulses that are close together in time and that generate a plurality of electromagnetic fields ("EMF") in an environment, wherein the plurality of lightning-waveform-feature sets include a first lightning-waveform-feature set received from a first lightning-detection sensor and a second lightning-waveform-feature set received from a second lightning-detection sensor;
  comparing the first lightning-waveform-feature set with the second lightning-waveform-feature set, including comparing waveform features of the first lightning-waveform-feature set with waveform features of the second lightning-waveform-feature set;
  time aligning the first lightning-waveform-feature set with the second lightning-waveform-feature set based on the comparing to generate a plurality of time-aligned waveform-feature sets; and
  geolocating each of the plurality of lightning pulses based on the plurality of time-aligned waveform-feature sets.

14. The method of claim 13, further comprising, prior to time aligning the first and second lightning-waveform-feature sets, performing an initial approximate time alignment of the first and second lightning-waveform-feature sets based on absolute time measurements included in or with the first and second lightning-waveform-feature sets.

15. The method of claim 13, wherein the comparing and the time aligning includes:
  comparing pairs of waveform features from the first and second lightning-waveform-feature sets in sequence, each of the pairs of waveform features including one waveform feature from the first lightning-waveform-feature set and another waveform feature from the second lightning-waveform-feature set; and
  advancing or delaying in time one of the first and second lightning-waveform-feature sets relative to the other until the pairs of sequentially compared waveform features match or substantially match.

16. The method of claim 15, wherein advancing or delaying in time one of the first and second lightning-waveform-feature sets relative to the other until the pairs of sequentially compared waveform features match or substantially match includes advancing or delaying in time one of the first and second lightning-waveform-feature sets relative to the other until, for each of at least some of the pairs, a value of the waveform feature of the first or second lightning-waveform-feature sets is within a threshold range of a value of the waveform feature of the other of the first or second lightning-waveform-feature sets.

17. The method of claim 13, wherein each of the plurality of lightning-waveform-feature sets further includes a waveform feature in the group consisting of: pulse duration, an initial-peak-to-opposite-peak time, an initial segment duration, opposite polarity overshoot duration, ratio of peak magnitude of an initial segment to peak magnitude of an opposite polarity overshoot, ratio of peak magnitude of an opposite polarity overshoot to peak magnitude of an initial segment, and area under a curve of pulse segments between zero crossings.

18. The method of claim 13, wherein the geolocating is based on a time difference of arrival calculation for each of the plurality of lightning pulses.

19. The method of claim 13, wherein at least some of the plurality of lightning pulses are separated in time by less than 300 microseconds.

20. A non-transitory computer-readable medium having computer-readable instructions stored thereon that are executable by a processor to perform or control performance of the method of claim 13.

* * * * *